(12) United States Patent
Takahashi et al.

(10) Patent No.: US 11,488,821 B2
(45) Date of Patent: Nov. 1, 2022

(54) FILM FORMING METHOD AND CRYSTALLINE MULTILAYER STRUCTURE

(71) Applicant: FLOSFIA INC., Kyoto (JP)

(72) Inventors: Isao Takahashi, Kyoto (JP); Takashi Shinohe, Kyoto (JP)

(73) Assignee: FLOSFIA INC., Kyoto (JP)

( * ) Notice: Subject to any disclaimer, the term of this patent is extended or adjusted under 35 U.S.C. 154(b) by 97 days.

(21) Appl. No.: 17/256,414

(22) PCT Filed: Jun. 21, 2019

(86) PCT No.: PCT/JP2019/024653
§ 371 (c)(1),
(2) Date: Dec. 28, 2020

(87) PCT Pub. No.: WO2020/004249
PCT Pub. Date: Jan. 2, 2020

(65) Prior Publication Data
US 2021/0272805 A1      Sep. 2, 2021

(30) Foreign Application Priority Data

Jun. 26, 2018  (JP) ............................. JP2018-121404

(51) Int. Cl.
*H01L 21/02* (2006.01)
*C23C 16/40* (2006.01)
(Continued)

(52) U.S. Cl.
CPC ........ *H01L 21/02496* (2013.01); *C23C 16/40* (2013.01); *C23C 16/52* (2013.01);
(Continued)

(58) Field of Classification Search
CPC ... H01L 29/24; H01L 29/04; H01L 21/02565; C30B 29/16; C30B 29/20; C30B 29/22; C23C 16/40
See application file for complete search history.

(56) References Cited

U.S. PATENT DOCUMENTS

2009/0174038 A1   7/2009  Wang
2010/0006836 A1   1/2010  Koukitu et al.
(Continued)

FOREIGN PATENT DOCUMENTS

JP        7-193003       7/1995
JP        2001-203266    7/2001
(Continued)

OTHER PUBLICATIONS

International Search Report dated Sep. 3, 2019 in corresponding International Application No. PCT/JP2019/024653.
(Continued)

*Primary Examiner* — Jaehwan Oh
(74) *Attorney, Agent, or Firm* — Wenderoth, Lind & Ponack, L.L.P.

(57) ABSTRACT

The disclosure provides a film forming method that enables to obtain an epitaxial film with reduced defects such as dislocations due to a reduced facet growth industrially advantageously, even if the epitaxial film has a corundum structure. When forming an epitaxial film on a crystal-growth surface of a corundum-structured crystal substrate directly or via another layer, using the crystal substrate having an uneven portion on the crystal-growth surface of the crystal substrate, generating and floating atomized droplets by atomizing a raw material solution including a metal; carrying the floated atomized droplets onto a surface of the (Continued)

crystal substrate by using a carrier gas; and causing a thermal reaction of the atomized droplets in a condition of a supply rate limiting state.

25 Claims, 13 Drawing Sheets

(51) Int. Cl.
    *C23C 16/52* (2006.01)
    *C30B 25/16* (2006.01)
    *C30B 25/18* (2006.01)
    *C30B 29/16* (2006.01)
    *H01L 29/24* (2006.01)

(52) U.S. Cl.
    CPC ............ *C30B 25/165* (2013.01); *C30B 25/18* (2013.01); *C30B 29/16* (2013.01); *H01L 21/0242* (2013.01); *H01L 21/0243* (2013.01); *H01L 21/0262* (2013.01); *H01L 21/02483* (2013.01); *H01L 21/02488* (2013.01); *H01L 21/02502* (2013.01); *H01L 21/02505* (2013.01); *H01L 21/02565* (2013.01); *H01L 21/02598* (2013.01); *H01L 21/02639* (2013.01); *H01L 29/24* (2013.01)

(56) References Cited

U.S. PATENT DOCUMENTS

| | | | |
|---|---|---|---|
| 2011/0175105 A1* | 7/2011 | Higashino | H01L 33/20 257/E33.025 |
| 2015/0194479 A1 | 7/2015 | Kaneko et al. | |
| 2015/0225843 A1 | 8/2015 | Oda et al. | |

FOREIGN PATENT DOCUMENTS

| | | |
|---|---|---|
| JP | 2010-516599 | 5/2010 |
| JP | 2010-232623 | 10/2010 |
| JP | 2012-174796 | 9/2012 |
| JP | 5343224 | 11/2013 |
| JP | 5397794 | 1/2014 |
| JP | 5397795 | 1/2014 |
| JP | 2014-72533 | 4/2014 |
| JP | 2016-98166 | 5/2016 |
| JP | 2016-100592 | 5/2016 |
| JP | 2016-100593 | 5/2016 |

OTHER PUBLICATIONS

Kazuhide Kusakabe et al., "Overgrowth of GaN layer on GaN nano-columns by RF-molecular beam epitaxy", Journal of Crystal Growth 237-239 (2002), pp. 988-992.

K. Y. Zang et al., "Defect reduction by periodic SiNx interlayers in gallium nitride grown on Si (111)", Journal of Applied Physics 101, 093502 (2007), pp. 093502-1 to 093502-4.

Kentaro Kaneko, "Growth and physical properties of corundum-structured gallium oxide alloy thin films", Dissertation, Kyoto Univ., Mar. 2013, pp. 1-116, w/English language Abstract (Cited in the specification).

Akio Takatsuka et al., "Eptaxial Lateral Overgrowth of α-$Ga_2O_3$ by Mist Epitaxy Technique", 2015, 62nd Spring Academic Lecture Meeting of the Society of Applied Physics, Tokai University, Mar. 11-14, 2015 13a-P18-12 (with translation).

* cited by examiner m-plane a-axis direction pattern

Ratio of growth rate vertical/horizontal : equal to or less than 0.5

FILM FORMING METHOD AND CRYSTALLINE MULTILAYER STRUCTURE

TECHNICAL FIELD

The disclosure relates to a method of forming epitaxial film that is useful for a semiconductor device and a crystalline multilayer structure obtained by the method.

BACKGROUND ART

When growing crystals on heterogeneous substrates, there is a problem of cracks and lattice defects. For this problem, matching the lattice constant and thermal expansion coefficient between the substrate and the film has been investigated. Further, when mismatch occurs in the lattice constant and the thermal expansion coefficient between the substrate and the film, a film formation technique such as ELO has been studied.

Patent Literature 1 discloses a method in which a buffer layer is formed on a heterogeneous substrate and a zinc oxide semiconductor layer is crystal-grown on the buffer layer. Patent Literature 2 discloses to form a mask of nanodots on a heterogeneous substrate, then to form a single crystal semiconductor material layer on the mask. Non-Patent Literature 1 discloses a method in which GaN is crystal-grown on sapphire, via a nanocolumn of GaN. Non-Patent Literature 2 discloses a method in which a GaN is crystal-grown on Si (111) by using a periodic SiN intermediate layer to reduce the defects such as pits.

However, each technique has a problem with a poor film formation rate, cracks in the substrate, dislocations, or warping. Further, dislocations and cracks or the like may occur in the epitaxial film, and thus, it was difficult to obtain an epitaxial film with enhanced quality. Furthermore, there has been also a problem in increasing a diameter of the substrate or thickness of the epitaxial film.

As a switching device of the next generation achieving high withstand voltage, low losses, and high temperature resistance, semiconductor devices using gallium oxide ($Ga_2O_3$) with a large band gap attract attention. Semiconductors using gallium oxide are expected to be applied to semiconductor power devices such as inverters. Moreover, since gallium oxide has a wide band gap, gallium oxide is also expected to be applied as a light-receiving/emitting device such as an LED or a sensor. According to Non-Patent Literature 3, gallium oxide has a band gap may be controlled by forming mixed crystal with indium or aluminum singly or in combination. Therefore, gallium oxide and such a mixed crystal of gallium oxide is extremely attractive material as InAlGaO-based semiconductors. Here, InAlGaO-based semiconductors refers to $In_xAl_yGa_zO$ ($0≤X≤2$, $0≤Y≤2$, $0≤Z≤2$, $X+Y+Z=1.5$ to $2.5$) can be viewed as the same material system containing gallium oxide.

However, since the most stable phase of gallium oxide is β-gallia structure, it is difficult to form a crystal film of corundum structure without using a special film formation method. Therefore, many problems still remain related to a crystal quality of gallium oxide. For this problem, the film formation of the crystalline semiconductor with the corundum structure is examined several at present. Patent Literature 3 describes a method of producing an oxide crystal thin film by a mist CVD method using bromide or iodide of gallium or indium. Patent Literatures 4 to 6 describe a multilayer structure in which a semiconductor layer having a corundum structure and an insulating film having a corundum structure are laminated on a substrate having a corundum structure.

Also, recently, as described in Patent Literatures 7 to 9 and Non-Patent Literature 4, an ELO-growth of a film of a corundum structured gallium oxide has been studied. According to the methods described in Patent Literatures 7 to 9, it is possible to obtain a corundum-structured gallium oxide film having a good quality. However, when the crystal film was actually observed, there were some problems such as facet growth, and it was not satisfactory yet.

Patent Literatures 3 to 9 are publications relating to patents or patent applications by the Applicant.

PRIOR ART DOCUMENT

Patent Literature

Patent Literature 1 JP-A-2010-232623
Patent Literature 2 JP-T-2010-516599
Patent Literature 3 Japanese Patent No. 5397794
Patent Literature 4 Japanese Patent No. 5343224
Patent Literature 5 Japanese Patent No. 5397795
Patent Literature 6 JP-A-2014-72533
Patent Literature 7 JP-A-2016-100592
Patent Literature 8 JP-A-2016-98166
Patent Literature 9 JP-A-2016-100593

Non-Patent Literature

Non-Patent Literature 1 Kazuhide Kusakabe., et al., "Overgrowth of GaN layer on GaN nano-columns by RF-molecular beam epitaxy", Journal of Crystal Growth 237-239 (2002) 988-992 Non-Patent Literature 2 K. Y. Zang., et al., "Defect reduction by periodic $SiN_x$ interlayers in gallium nitride grown on Si (111)", Journal of Applied Physics 101, 093502 (2007) Non-Patent Literature 3 Kentaro Kaneko, "Growth and Physical Properties of Corundum Structured Gallium Oxide Mixed Crystal Thin Films," Dr. Paper of Kyoto University, March 2013 Non-Patent Literature 4 Tameo Takatsuka, Shinya Oida, Kentaro Kaneko, Shizuo Fujita, Ryuji Hiratsu, "Lateral Selective Growth of α-type Gallium Oxide by Mist Epitaxy Method (ELO)", 2015, 62nd Spring Academic Lecture Meeting of the Society of Applied Physics, Tokai University, Mar. 11-14, 2015 13a-P18-12.

SUMMARY OF INVENTION

Technical Problem

It is an object of the disclosure to provide a film forming method that is capable of forming an epitaxial film with reduced defects such as dislocations caused by facet growth industrially advantageously, even if the epitaxial film has a corundum structure.

Solution to Problem

As a result of earnest examination to achieve the above object, the inventors have found following things. By using the m-plane sapphire substrate in which the stripe-shaped ELO mask extending in the a-axis direction is arranged on the substrate surface, the ELO film formation in a supply-controlled, the facet growth is suppressed, various defects that caused the leakage current were reduced. The present inventors have found that the crystalline oxide film thus obtained can solve the above-described problems.

Further, after obtaining the above findings, the present inventors have further studied to complete the present invention.

In other words, the present invention relates to the following disclosure.

[1] A method of forming a film, including: forming an epitaxial film on a crystal-growth surface of a crystal substrate directly or via another layer, the crystal substrate having a corundum structure, the crystal substrate having an uneven portion on the crystal substrate, and forming the epitaxial film in a condition of a supply rate limiting state.

[2] The method of forming the film according to [1], wherein the uneven portion is provided in a direction that is perpendicular or approximately perpendicular to the c-axis.

[3] The method of forming the film according to [1] or [2], wherein a film is formed by generating and floating atomized droplets by atomizing a raw material solution including a metal; carrying the floated atomized droplets onto a surface of the crystal substrate by using a carrier gas; and causing a thermal reaction of the atomized droplets.

[4] The method of forming the film according to [3], wherein the carrying the atomized droplets is conducted in a condition of a flow rate of the carrier gas that is supply rate limiting state.

[5] The method of forming the film according to [4] or [5], wherein the metal includes at least one or more metals selected from a metal of period 4 to period 6 in the periodic table.

[6] The method of forming the film according to any one of [3] to [5], wherein the metal includes at least a metal selected from gallium, indium, rhodium and iridium.

[7] The method of forming the film according to any one of [1] to [6], wherein the uneven portion is formed on the crystal-growth surface of the crystal substrate in a stripe shape or in a dot shape.

[8] A crystalline multilayer structure including: a crystal substrate having a corundum structure, the crystal substrate including an uneven portion provided directly or via another layer on a crystal-growth surface of the crystal substrate in a direction that is perpendicular or approximately perpendicular to the c-axis; an epitaxial layer provided on the uneven portion, the epitaxial layer including a lateral growth area that includes a corundum structure, and a crystal-growth direction of the lateral growth area is parallel or approximately parallel to the crystal-growth surface.

[9] The crystalline multilayer structure according to [8], wherein the crystal-growth direction of the lateral growth area is parallel or approximately parallel to the c-axis.

[10] The crystalline multilayer structure according to [8] or [9], wherein the lateral growth area is substantially free from a facet growth area.

[11] The crystalline multilayer structure according to any one of [8] to [10], wherein the lateral growth area includes a metal oxide as a major component, and wherein the metal oxide includes at least one or more metals selected from a metal of period 4 to period 6 of the periodic table.

[12] The crystalline multilayer structure according to [11], wherein the metal includes at least a metal selected from gallium, indium, rhodium and iridium.

[13] The crystalline multilayer structure according to any one of [8] to [12], wherein the uneven portion is formed on the crystal-growth surface of the crystal substrate in a stripe shape.

[14] A crystalline multilayer structure, comprising: a crystal substrate having a corundum structure, the crystal substrate including an uneven portion provided directly or via another layer on a crystal-growth surface of the crystal substrate in a direction that is perpendicular or approximately perpendicular to the c-axis; a crystalline oxide that is formed by bonding a first crystalline oxide and a second crystalline oxide that are crystal-grown in a direction that is parallel or approximately parallel to the crystal-growth surface of the crystal substrate; an epitaxial layer provided on the bonding surface of the first crystalline oxide and the second crystalline oxide.

[15] The crystalline multilayer structure according to [14], wherein the crystalline oxide is formed by bonding the first crystalline oxide and the second crystalline oxide that are crystal-grown in a direction that is parallel or approximately parallel to the c-axis.

[16] The crystalline multilayer structure according to [14] or [15], wherein the epitaxial layer is substantially free from a facet growth area.

[17] The crystalline multilayer structure according to any one of [14] to [16], wherein the epitaxial layer includes a metal oxide as a major component, and wherein the metal oxide includes at least one or more metals selected from a metal of period 4 to period 6 of the periodic table.

[18] The crystalline multilayer structure according to [17], wherein the metal includes at least a metal selected from gallium, indium, rhodium and iridium.

[19] The crystalline multilayer structure according to any one of [14] to [18], wherein the uneven portion is formed on the crystal-growth surface of the crystal substrate in a stripe shape.

[20] A method of forming a film, including: forming an epitaxial film on a crystal-growth surface of a crystal substrate directly or via another layer, the crystal substrate having a corundum structure, and forming the film in a condition of a supply rate limiting state.

[21] The method of forming the film according to [20], wherein the film is crystal-grown to a lateral direction to the crystal-growth surface.

[22] The method of forming the film according to [21], wherein the film is crystal-grown to a direction that is parallel or approximately parallel to the c-axis.

[23] The method of forming the film according to any one of [20] to [22], wherein the film is formed by generating atomized droplets by atomizing a raw material solution including a metal; carrying the atomized droplets onto a surface of the crystal substrate by using a carrier gas; and causing a thermal reaction of the atomized droplets.

[24] The method of forming the film according to [23], wherein a flow rate of the carrier gas is not more than 1 LPM.

[25] The method of forming the film according to [23] or [24], wherein the metal includes at least a metal selected from gallium, indium, rhodium and iridium.

Advantageous Effects

According to the film forming method of the disclosure, even if the epitaxial film has a corundum structure, an epitaxial film with reduced defects such as dislocations due to a reduced facet growth can be obtained industrially advantageously.

DESCRIPTION OF EMBODIMENTS

Figure 1:
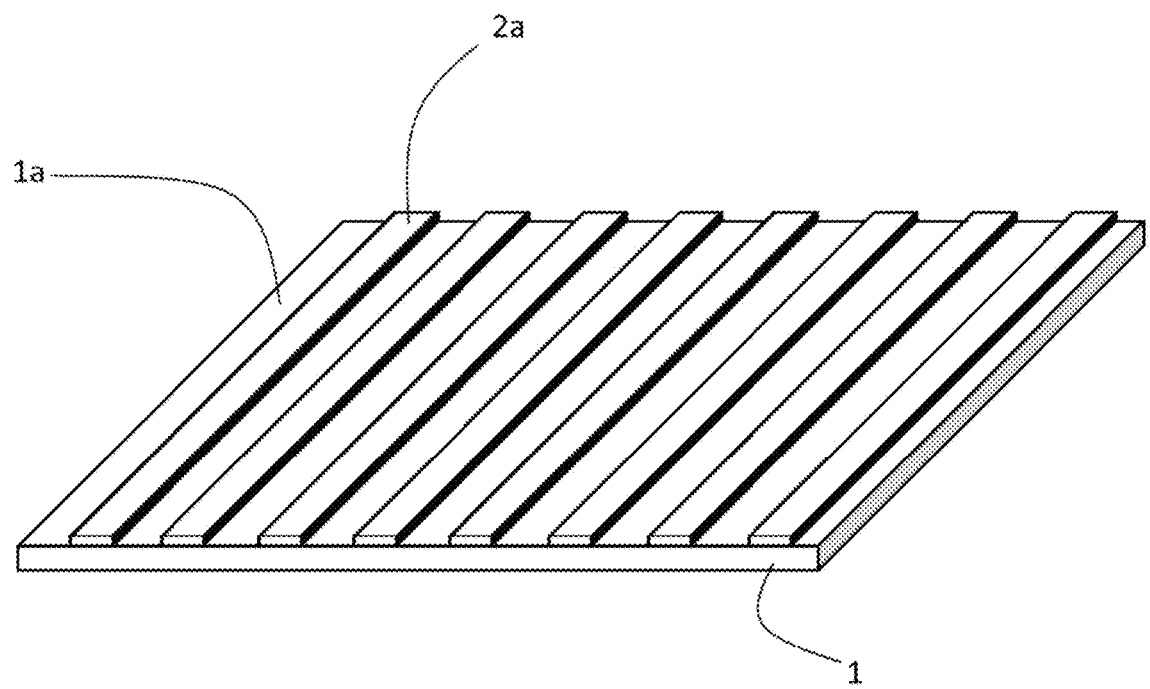
FIG. 1 is a schematic perspective diagram illustrating an embodiment of an uneven portion formed on the crystal-growth surface of the crystal substrate used in the disclosure.

A film forming method according to an embodiment of the disclosure is a method of forming a film, including: forming an epitaxial film on a crystal-growth surface of a crystal substrate directly or via another layer, the crystal substrate having a corundum structure, the crystal substrate having an uneven portion on the crystal substrate, and forming the film in a condition of a supply rate limiting state.

<Crystal Substrate>

The crystal substrate is not particularly limited as long as the crystal substrate has a corundum structure. The crystal substrate may be a known substrate. The crystal substrate may be an insulator substrate, may be a conductive substrate, or may be a semiconductor substrate. The crystal substrate may be a single crystal substrate, or may be a polycrystalline substrate. Examples of the crystal substrate include a substrate containing a crystal having a corundum structure as a major component. The term "major component" herein means that the crystal is preferably contained in the substrate at an composition ratio that is 50% or more of the crystalline material, preferably 70% or more, and more preferably 90% or more. Examples of the crystal substrate having the corundum structure includes a sapphire substrate, an α-type gallium oxide substrate.

According to the disclosure, the crystal substrate is preferably a sapphire substrate. Examples of the sapphire substrate includes a c-plane sapphire substrate, an m-plane sapphire substrate, and an a-plane sapphire substrate. Further, the sapphire substrate may have an off angle. The off angle is not particularly limited, and may be preferably in range of from 0° to 15°. Further, according to the disclosure, the sapphire substrate is preferably the m-plane sapphire substrate.

A thickness of the crystal substrate is not particularly limited. The thickness of the crystal substrate may be preferably in a range of from 10 μm to 2000 μm, and more preferably in a range of from 50 μm to 1000 μm.

<Uneven Portion>

The uneven portion is not particularly limited as long as the uneven portion includes a convex portion or a concave portion. The uneven portion may be a convex portion. The uneven portion may be a concave portion. The uneven portion may include the convex portion and the concave portion. That is, the uneven portion may include at least one concave portion or one convex portion. Further, the uneven portion preferably includes a plurality of concave portions and/or convex portions. In this case, the uneven portion may be formed from regular convex portions or concave portions may be formed from irregular convex portions or concave portions. According to the disclosure, it is preferable that the uneven portion is formed periodically, more preferably formed periodically and regularly patterned. A shape of the uneven portion is not particularly limited. Examples of the shape of the uneven portion includes stripe, dot, mesh-like, and random-like. According to the disclosure, the shape of the uneven portion is preferably a stripe or dot, more preferably a stripe. In the case of forming the uneven portion in a dot shape, the uneven shape may be provided, for example, periodically and regularly, in a lattice position such as square lattice, orthorhombic lattice, triangular lattice, a hexagonal lattice. In this case, the uneven shape is in a shape of polygonal shape such as triangular, square (e.g., square, rectangular or trapezoidal, etc.), pentagonal or hexagonal, circular, or an ellipse. A cross-sectional shape of the concave portion or convex portion of the uneven portion is not particularly limited. Examples of the cross-sectional shape of the concave portion or convex portion of the uneven portion includes U-shaped, inverted U-shaped, corrugated, triangular, square (e.g., square, rectangular or trapezoidal, etc.), a polygon such as pentagon or hexagon.

A material of the convex portion is not particularly limited, and may be a known material. The material of the convex portion may be an insulator material, may be a conductive material, or may be a semiconductor material. The material of the convex portion is preferably a material capable of inhibiting crystal growth in a longitudinal direction. Further, the material of the convex portion may be amorphous, may be a single crystal, or may be polycrystalline. Examples of the material of the convex portion includes an oxide, nitrides or carbides of Si, Ge, Ti, Zr, Hf, Ta, or Sn. Examples of the material of the convex portion includes carbon, diamond, metal, or a mixture thereof. More specifically, examples of the material of the convex portion includes $SiO_2$, a Si-containing compound containing SiN or polycrystalline silicon as a main component, a metal having a melting point higher than the crystal growth temperature of the crystalline semiconductor (e.g., platinum, gold, silver, palladium, rhodium, iridium, ruthenium, etc.). The constituent material is preferably contained in the convex portion at a composition ratio of 50% or more, more preferably contained in an amount of 70% or more, and most preferably contained in an amount of 90% or more.

A method of forming the convex portion may be a known method. Examples of the method for forming the convex portion includes photolithography, electron beam lithography, laser patterning and subsequent etching (e.g., dry etching or wet etching) known patterning methods such as. According to the disclosure, the convex portion is preferably stripe-shaped or dot-like-shaped, and more preferably stripe-shaped.

A material of the concave portion is not particularly limited. The material of the concave portion may be the same as the material of the convex portion. The constituent material of the concave portion may be the crystal substrate. According to the disclosure, it is preferable that the concave portion is dot-shaped. According to the disclosure, it is preferable that a dot-shaped concave portion is provided on a mask layer that is made of a silicon-containing compound. A method of forming the concave portion may be the same method as the method of forming the convex portion described above. Further, it is also preferable that the concave portion is a void layer provided on the crystal growth surface of the crystal substrate. The void layer may be formed by providing a groove in the crystal substrate by using a known groove processing method on the crystal growth surface of the crystal substrate. A width, depth, and the terrace width of the groove of the void layer are not particularly limited unless it deviates from an object of the disclosure, and may be set appropriately. In addition, air may be contained in the void layer, or an inert gas or the like may be contained in the void layer.

According to an embodiment of the present disclosure, it is preferable that the uneven portion including the concave portion and/or convex portion are formed on the crystal-growth surface in a direction of in a direction perpendicular or substantially perpendicular to the c-axis. By forming the uneven portion in such a way, it is possible to suppress facet growth. Also, by forming the uneven portion in such a way, it is possible to realize a film formation that is more suitable for semiconductor devices. According to an embodiment of the disclosure, the term "perpendicular or substantially perpendicular to the c-axis", usually means that the angle formed by a certain direction and the c-axis direction is within the range of 90 degrees±10 degrees. Also, according to an embodiment of the disclosure, the term "perpendicular or substantially perpendicular to the c-axis" preferably means that the angle formed between the certain direction and the c-axis direction is in the range of 90 degrees±5 degrees.

Hereinafter, preferred embodiments of the disclosure are described with reference to drawings. FIG. 1 is a schematic diagram illustrating an uneven portion provided on the crystal-growth surface of the crystal substrate according to an embodiment of the disclosure. The uneven portion of FIG. 1 includes a crystal substrate 1 and a convex portion 2a provided on a crystal-growth surface 1a. The convex portion 2a is stripe-shaped. The convex portion 2a, that is stripe-shaped, is provided periodically on the crystal-growth surface 1a of the crystal substrate 1. The convex portion 2a is made of a silicon-containing compound such as $SiO_2$. The convex portion 2a may be formed using known methods such as photolithography.

Figure 2:
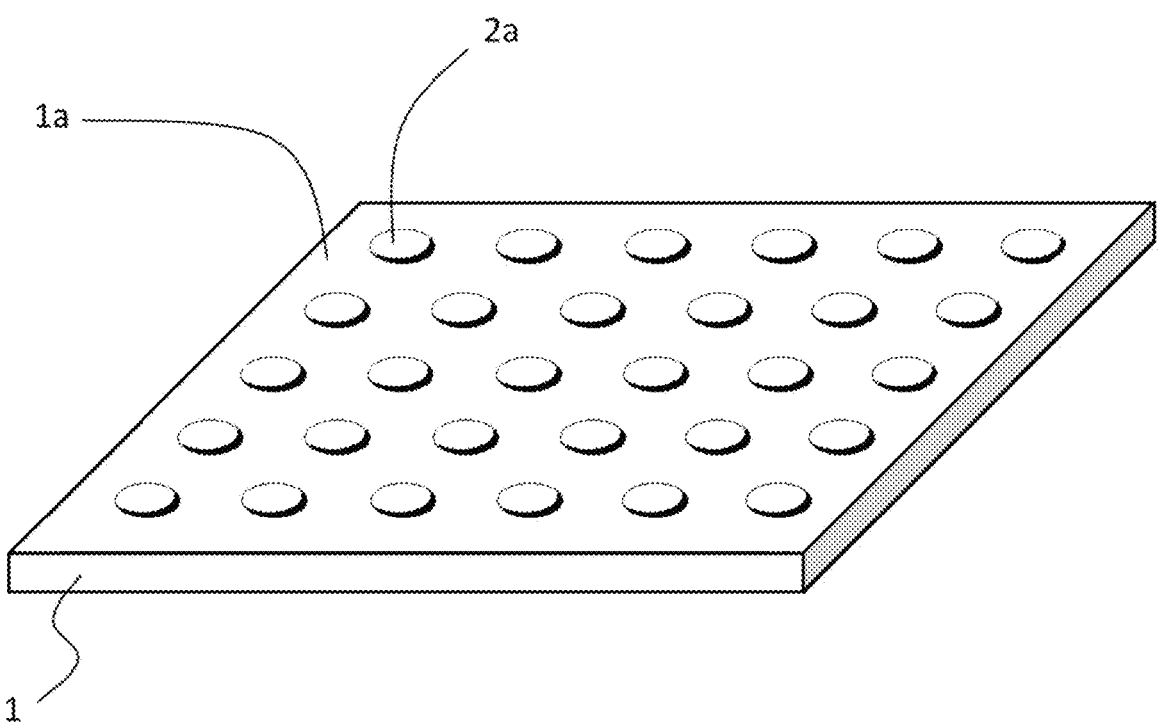
FIG. 2 is a schematic perspective diagram illustrating an embodiment of the uneven portion formed on the crystal growth surface of the crystal substrate used in the disclosure.

FIG. 2 shows an uneven portion provided on the crystal growth surface of the crystal substrate according to an embodiment of the disclosure. FIG. 2 shows a different aspect of the disclosure compared to FIG. 1. The uneven portion of FIG. 2 includes a crystal substrate 1 and a convex portion 2a provided on the crystal growing surface 1a of the crystal substrate 1. The convex portion 2a is dot-shaped. The dot-shaped convex portion 2a is provided periodically and regularly on the crystal-growth surface 1a of the crystal substrate 1. The convex portion 2a is made of a silicon-containing compound such as $SiO_2$. The convex portion 2a may be formed using known methods such as photolithography.

Figure 3:
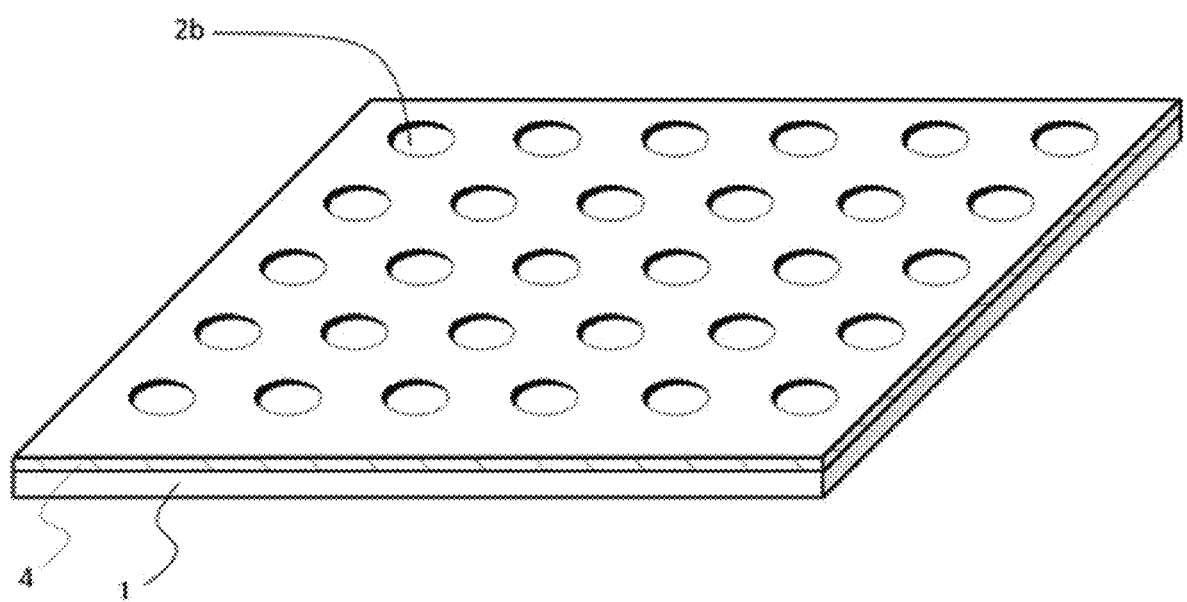
FIG. 3 is a schematic perspective diagram illustrating an embodiment of the uneven portion formed on the crystal growth surface of the crystal substrate used in the disclosure.

FIG. 3 is a schematic diagram illustrating an uneven portion provided on the crystal-growth surface of the crystal substrate according to an embodiment of the disclosure. The uneven portion of FIG. 3 includes a concave portion 2b, rather than the convex portion. The concave portion of FIG. 3 includes a crystal substrate 1 and a mask layer 4. The mask layer 4 is formed on the crystal growth surface 1. The mask layer 4 has dot-shape holes. The crystal substrate 1 is exposed from the dot-shaped holes of the mask layer 4. The concave portion 2b is formed the dot-shaped holes. The concave portion 2b may be provide by forming the mask layer 4 by using known methods such as photolithography. Further, the mask layer 4 is not particularly limited as long as the mask layer 4 is capable of inhibiting crystal growth in a longitudinal direction. Examples of a material of the mask layer 4 includes a known material such as a silicon-containing compound such as $SiO_2$.

Figure 4:
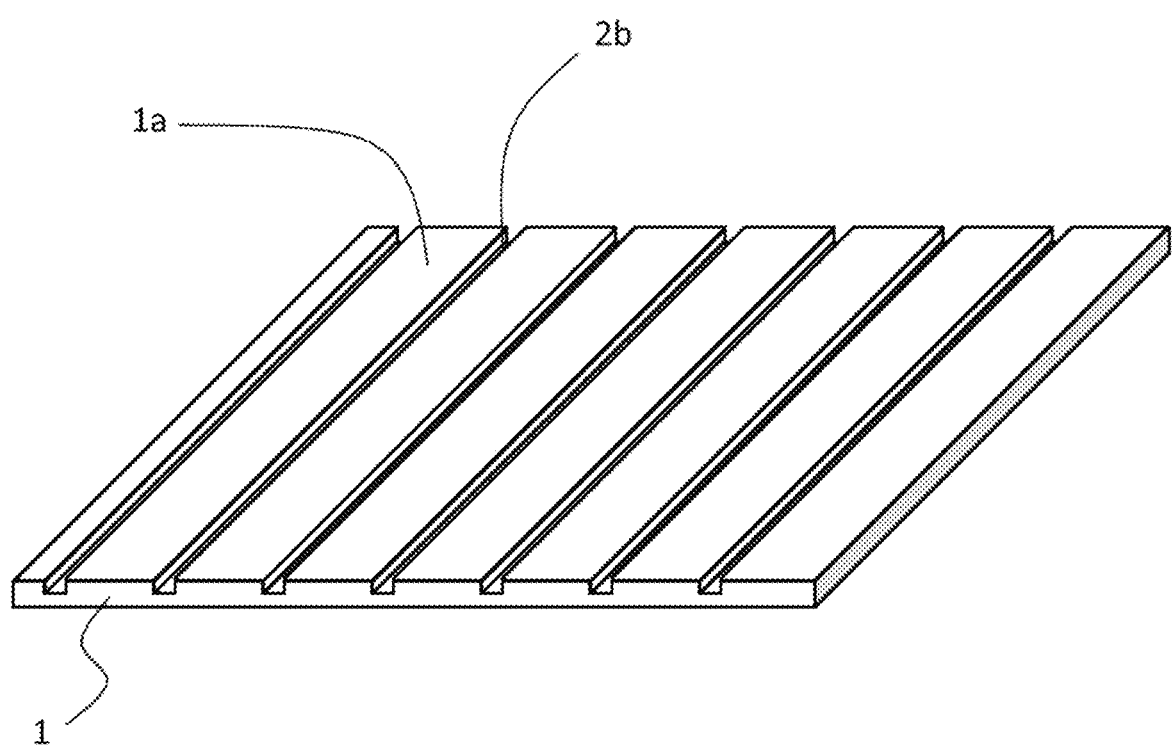
FIG. 4 is a schematic perspective diagram illustrating an embodiment of the uneven portion formed on the crystal growth surface of the crystal substrate used in the disclosure.

FIG. 4 is a schematic diagram illustrating an uneven portion provided on the crystal-growth surface of the crystal substrate according to an embodiment of the disclosure. The uneven portion of FIG. 4 is formed from a crystal substrate 1 and a void layer. A shape of the void layer is stripe. The stripe-shaped concave portion 2b is provided periodically on a crystal-growth surface 1a of a crystal substrate 1. The concave portion 2b may be formed by known grooving methods.

Figure 5:
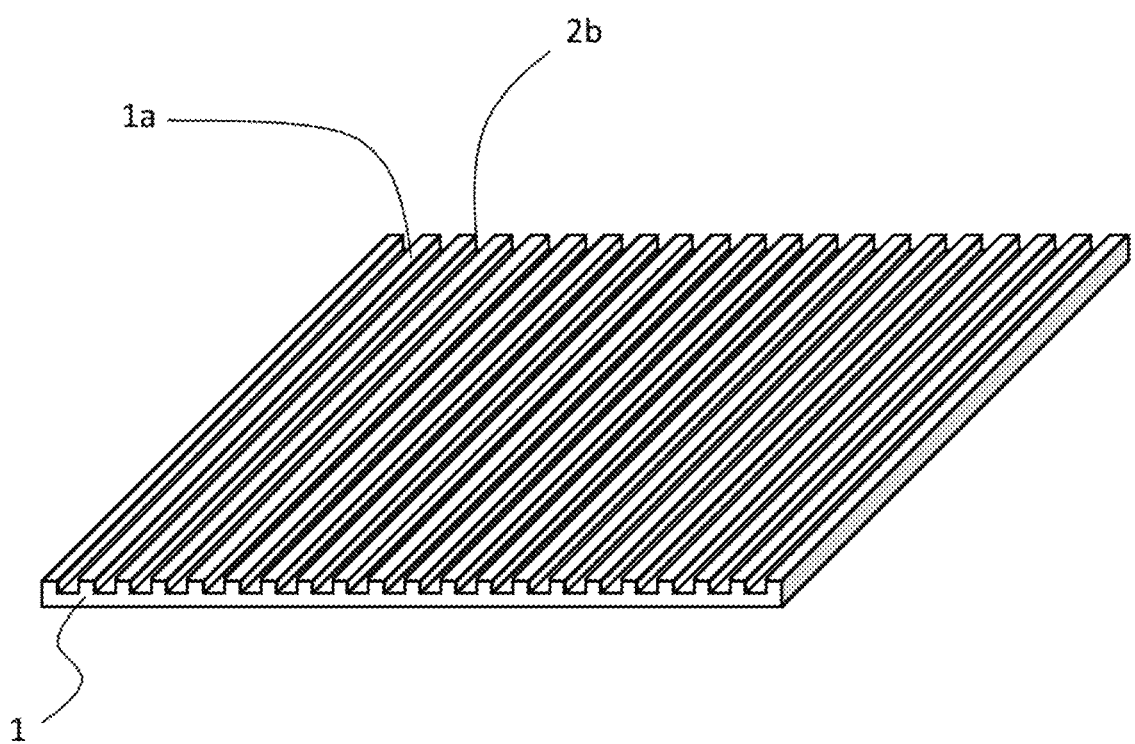
FIG. 5 is a schematic perspective diagram illustrating an embodiment of the uneven portion formed on the crystal growth surface of the crystal substrate used in the disclosure.

FIG. 5 is a schematic diagram illustrating an uneven portion provided on the crystal-growth surface of the crystal substrate according to an embodiment of the disclosure. The uneven portion of FIG. 5 differs from the uneven portion of FIG. 4 in a distance between each concave portion 2b. A width between each uneven portion in FIG. 5 is smaller than a width between each uneven portion in FIG. 4. That is, a terrace width of the uneven portion 2b in FIG. 4 is wider and a terrace width of the uneven portion in FIG. 5 is narrower. The concave portion 2b of FIG. 5 may be formed by using known grooving methods.

Figure 6:
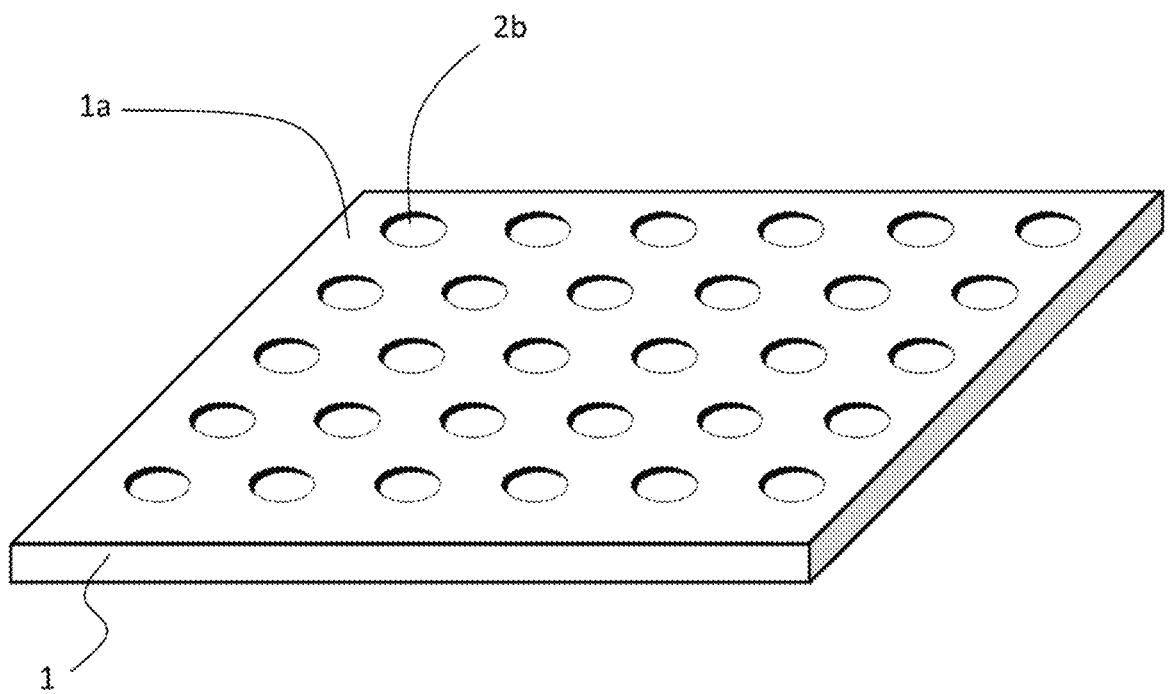
FIG. 6 is a schematic perspective diagram illustrating an embodiment of the uneven portion formed on the crystal growth surface of the crystal substrate used in the disclosure.

FIG. 6 is a schematic diagram illustrating an uneven portion provided on the crystal-growth surface of the crystal substrate according to an embodiment of the disclosure. The uneven portion of FIG. 6 includes a crystal substrate 1 and a void layer. The void layer is dot-shaped, unlike FIG. 4 and FIG. 5. The dot-shaped concave portion 2b is provided periodically and regularly on a crystal-growth surface 1a of the crystal substrate 1. The concave portion 2b may be formed by known grooving methods.

Width and height of the convex portion of the uneven portion, the width and depth of the concave portion, such as spacing is not particularly limited. According to an embodiment of the disclosure, a width, a depth, and an interval of the concave portion are respectively in a range of, for example, approximately from 10 nm to 1 mm. It is preferable that the width, the depth, and the interval of the concave portion are respectively in a range of approximately from 10 nm to 300 μm. It is more preferable that the width, the depth, and the interval of the concave portion are respectively in a range of approximately 10 nm to 1 μm. It is the most preferable that the width, the depth, and the interval of the concave portion are respectively in a range of approximately 100 nm to 1 μm.

According to an embodiment of the disclosure, another layer such as buffer layer and stress relaxation layer may be provided on the crystal substrate. In this case, the uneven portion may be provided on another layer or under another layer. Usually, the uneven portion is formed on another layers.

As described above, the uneven portion including the convex portion and/or concave portion is provided directly or via another layer on the crystal-growth surface of the crystal substrate. After forming the uneven portion, by forming a film under the condition that a supply rate limiting state, it is possible to realize a lateral growth with out facet growth on the uneven portion. Therefore, an epitaxial layer containing a corundum-structured crystalline semiconductor as a major component that has a good quality may be easily formed.

A method of epitaxial crystal-growth is not particularly limited unless it deviates from an object of the disclosure, and may be a known method. Examples of the epitaxial crystal-growth method includes CVD method, MOCVD method, MOVPE method, mist-CVD method, mist-epitaxy method, MBE method, HVPE method or pulse-growth method. According to an embodiment of the disclosure, the epitaxial crystal growth method is preferably mist CVD method, mist epitaxy method or HVPE method, and is more preferably mist CVD method or mist epitaxy method.

According to an embodiment of the disclosure, the film formation is conducted by generating and floating atomized droplets by atomizing a raw material solution containing a metal (atomization step), carrying the floated atomized droplets to the vicinity of the crystal substrate by using a carrier gas (carrying step), then, causing a thermal reaction of the atomized droplets (film forming step). By forming the film in this way, it is possible to realize a lateral growth without facet growth more easily.

(Raw material solution) The raw material solution is not particularly limited as long as the raw material solution contains a metal as a raw material of film forming, and is capable of being atomized. The raw material solution may contain an inorganic material or may contain an organic material. The metal is not particularly limited unless it deviates from an object of the disclosure. The metal may be a single element and may be a metal compound. Examples of the metal includes one or more metal selected from gallium (Ga), iridium (Ir), indium (In), rhodium (Rh), aluminum (Al), gold (Au), silver (Ag), platinum (Pt), copper (Cu), iron (Fe), manganese (Mn), nickel (Ni), palladium (Pd), cobalt (Co), ruthenium (Ru), chromium (Cr), molybdenum (Mo), tungsten (W), tantalum (Ta), zinc (Zn), lead (Pb), rhenium (Re), titanium (Ti), tin (Sn), gallium (Ga), magnesium (Mg), calcium (Ca) and zirconium (Zr). According to an embodiment of the disclosure, the metal preferably includes at least one or more metals selected from period 4 to period 6 of the periodic table. The metal more preferably includes at least gallium, indium, rhodium or iridium. By using such a preferred metal, it is possible to form an epitaxial film that is more suitable for semiconductor devices.

According to an embodiment of the disclosure, the raw material solution containing the metal, in a form of complex or salt, dissolved or dispersed in an organic solvent or water may be used. Examples of the form of the complex include an acetylacetonate complex, a carbonyl complex, an ammine complex, a hydride complex. Also, examples of the form of the salt include an organic metal salt (e.g., metal acetate, metal oxalate, metal citrate, etc.), metal sulfide, metal nitrate, phosphorylated metal, metal halide (e.g., metal chloride, metal bromide, metal iodide, etc.).

A solvent of the raw material solution is not particularly limited unless it deviates from an object of the present invention, and the solvent may be an inorganic solvent such as water. The solvent may be an organic solvent such as alcohol. Also, the solvent may be a mixed solvent of the inorganic solvent and the organic solvent. According to an embodiment of the disclosure, the solvent preferably includes water.

Further, the raw material solution may contain a hydrohalic acid and/or an oxidant as an additive. Examples of the hydrohalic acid include hydrobromic acid, hydrochloric acid and hydroiodic acid. Examples of the oxidant include hydrogen peroxide ($H2O2$), sodium peroxide ($Na2O2$), barium peroxide ($BaO2$), a peroxide including benzoyl peroxide ($C6H5CO$)$2O2$, hypochlorous acid (HClO), perchloric acid, nitric acid, ozone water, and an organic peroxide such as peracetic acid and nitrobenzene.

The raw material solution may contain a dopant. The dopant is not particularly limited unless it deviates from an object of the disclosure. Examples of the dopant include tin, germanium, silicon, titanium, zirconium, vanadium and niobium. The dopant concentration in general may be in a range of from approximately in a range of from $1 \times 10^{16}/cm^3$ to $1 \times 10^{22}/cm^3$. The dopant concentration may be at a lower concentration of, for example, approximately equal to or less than $1 \times 10^{17}/cm^3$. According to an embodiment of the disclosure, the dopant may be contained at a high concentration of, for example, approximately equal to or more than $1 \times 10^{20}/cm^3$.

(Atomization Step)

At an atomization step, the raw material solution is prepared, and the raw material solution is atomized so as to float droplets and to generate atomized droplets. A concentration of the metal contained in the raw material solution is not particularly limited. The concentration of the metal contained in the raw material solution may be preferably in a range of from 0.0001 mol/L to 20 mol/L with respect to the entire raw material solution. A method to atomize the raw material solution is not particularly limited if it is possible to atomize the raw material solution and may be a known atomizing method. In embodiments of the disclosure, an atomization method using ultrasonic vibration is preferred. According to an embodiment of the disclosure, the method to atomize the raw material solution is an atomizing method using ultrasonic vibration. A mist used in the present invention is capable of being suspended in the air. The mist used in an embodiment of the present invention have an initial rate of zero to be delivered as a gas, is not blown like a spray, for example, and thus, is not damaged by collision energy. Accordingly, the mist obtained using ultrasonic vibration is preferable. A size of the mist is not particularly limited, and the mist may be approximately several mm. The size of the mist is preferably equal to or less than 50 and more preferably in a range of from 1 μm to 10 μm.

(Carrying Step)

At a carrying step, the atomized droplets are delivered to the substrate by using a carrier gas. The carrier gas is not particularly limited unless it deviates from an object of the present invention. Examples of the carrier gas include oxygen, ozone, an inert gas such as nitrogen and argon and a reducing gas such as hydrogen gas and a forming gas. The carrier gas may include one type of carrier gas. Further, the carrier gas may contain one or two or more gasses. Also, a diluted gas (e.g., 10-fold diluted carrier gas) and the like may be further used as a second carrier gas. The carrier gas may be supplied from one or more locations. The flow rate of the carrier gas is not particularly limited. A flow rate the carrier gas may be preferably a flow rate that enables the carrying step to be a supply rate limiting state. More specifically, the flow rate of the carrier gas is preferably equal to or not more than 1 LPM, and more preferably in a range of from 0.1 LPM to 1 LPM.

(Film Formation Step)

At a film forming step, a film is formed on the uneven portion by a reaction of the atomized droplets. The reaction is not particularly limited as long as the film is formed from the atomized droplets in the reaction. According to an embodiment of the disclosure, the reaction is preferably a thermal reaction. The thermal reaction may be a reaction in which the atomized droplets react with heat. Reaction conditions and the like are not particularly limited unless it deviates from an object of the present invention. In the film forming step, the thermal reaction is in generally carried out at an evaporation temperature of the solvent of the raw material solution or at a higher temperature than the evaporation temperature. The temperature during the thermal reaction should not be too high, and preferably equal to or less than 650° C. Further, the thermal reaction may be conducted in any atmosphere unless it deviates from an object of the disclosure. The thermal reaction may be conducted in a vacuum atmosphere, a non-oxygen atmosphere, a reducing gas atmosphere and an oxygen atmosphere. In addition, the thermal reaction may be conducted under any condition including under an atmospheric pressure, under an increased pressure, and under a reduced pressure. According to an embodiment of the disclosure, the thermal reaction may be preferably conducted under an atmospheric pressure. By conducting the thermal reaction under an atmospheric pressure, a calculation of an evaporation temperature would be easier and an equipment and the like would be more simplified. Further, a film thickness of the crystalline oxide semiconductor can be set by adjusting a deposition time.

Hereinafter, with reference to drawings, a deposition apparatus 19 used in an embodiment of the present invention is described. The deposition apparatus 19 of FIG. 9 includes a carrier gas source 22a to supply a carrier gas, a flow control valve 23a that is configured to control a flow rate of the carrier gas supplied from the carrier gas source 22a, a carrier gas (diluted) source 22b to supply a carrier gas (diluted), a flow control valve 23b that is configured to control a flow rate of the carrier gas supplied (diluted) from the carrier gas (diluted) source 22b, a mist generator 24 containing a raw material solution 24a, a container 25 containing water 25a, an ultrasonic transducer 26 attached to a bottom of the container 25, a deposition chamber 30, a quartz supply pipe 27 connecting from the mist generator 24 to the deposition chamber 30, and a hot plate (heater) 28 arranged in the deposition chamber 30. A substrate 20 may be set on the hot plate 28.

Figure 9:
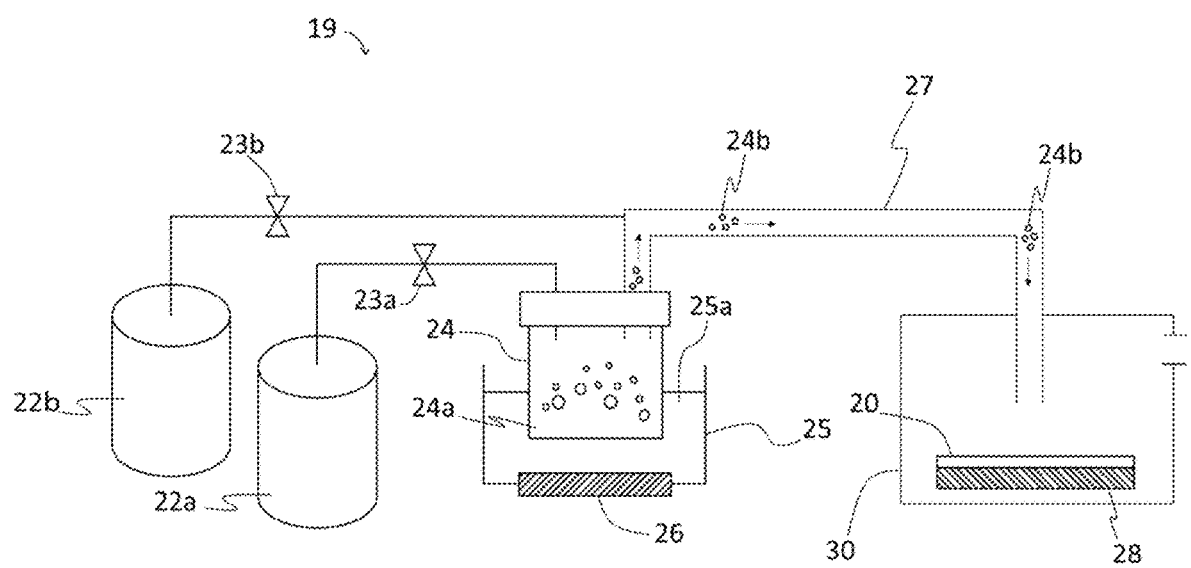
FIG. 9 is a schematic configuration diagram illustrating an embodiment of a deposition apparatus (mist CVD apparatus) used in the disclosure.

Then, as described in FIG. 9, the raw material solution 24a is set in the mist generator 24. The substrate 20 is placed on the hot plate 28. The hot plate 28 is activated to raise a temperature in the deposition chamber 30. Then, the flow control valve 23 (23a, 23b) is opened to supply the carrier gas from the carrier gas source 22 (22a, 22b) into the deposition chamber 30. After the atmosphere in the deposition chamber 30 is sufficiently replaced with the carrier gas, the flow rate of the carrier gas and the carrier gas (diluted) are adjusted respectively. The ultrasonic transducer 26 is then vibrated, and a vibration propagate through the water 25a to the raw material solution 24a to atomize the raw material solution 24a to generate atomized droplets 24b. The atomized droplets 24b are introduced into the deposition chamber 30 by the carrier gas, and is delivered to the substrate 20. Then, under an atmospheric pressure, the atomized droplets 24b in the deposition chamber 30 is thermally reacted to form a film on the substrate 20.

Figure 10:
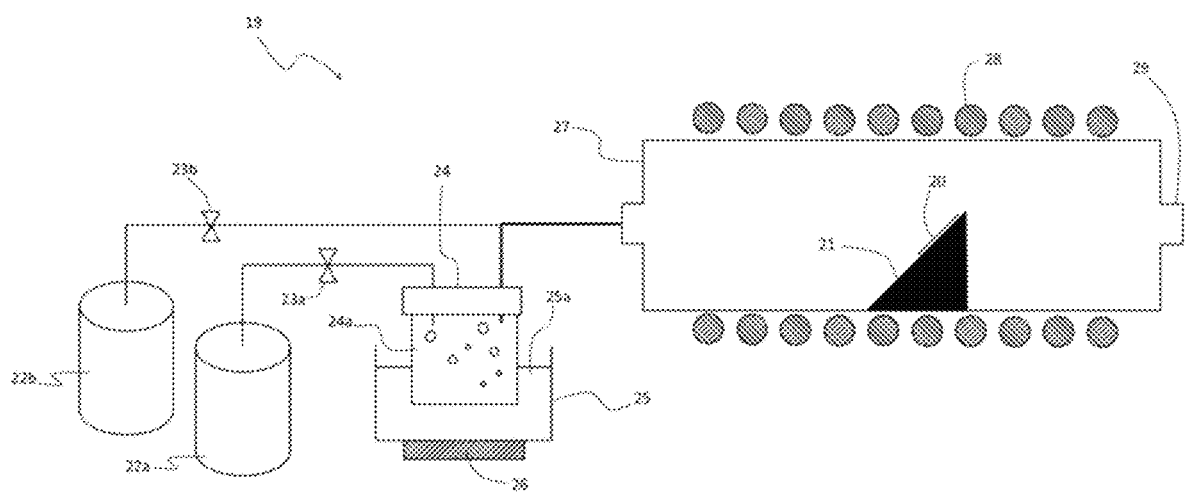
FIG. 10 is a schematic configuration diagram illustrating another embodiment of a deposition apparatus (mist CVD apparatus) used in the disclosure.

Further, it is also preferable to use a mist CVD apparatus (deposition apparatus) 19 shown in FIG. 10. The Mist CVD apparatus 19 of FIG. 10 includes a susceptor 21 on which a substrate 20 is placed, a carrier gas supply device 22a to supply a carrier gas, a flow rate control valve 23a that is configured to control a flow rate of the carrier gas supplied from the carrier gas supply device 22a, a carrier gas (diluted) supply device 22b, a flow rate control valve 23b that is configured to control a flow rate of the carrier gas (diluted) supplied from the carrier gas (dilute) supply device 22b, a mist generator 24 containing a raw material solution 24a, a container 25 containing water 25a, an ultrasonic transducer 26 attached to a bottom of the container 25, a supply pipe 27 made of a quartz tube having an inner diameter of 40 mm, a heater 28 arranged at a peripheral portion of the supply pipe 27, an air duct 29 that is configured to emit mist and droplets after thermal reaction and to emit an exhaust gas. The susceptor 21 is made of quartz, the surface for placing the substrate 20 is inclined from the horizontal plane. The susceptor 21 is made of quartz. The susceptor 21 includes a surface that is slanted off the horizontal and on that the substrate 20 is arranged. Since the susceptor 21 and the supply pipe 27 that is configured to be a deposition chamber are made of quartz, impurities from the device that is introduced into the film formed on the substrate 20 is suppressed. The Mist CVD apparatus 19 can be treated in the same way as the deposition apparatus 19 of FIG. 9 that is described above.

The above-mentioned preferable film forming apparatus enables to form an epitaxial layer more easily on the crystal-growth surface of the crystal substrate. The epitaxial layer is usually formed by epitaxial crystal growth method.

According to the preferred film forming method, a crystalline multilayer structure may be produced. The crystalline multilayer structure is a crystalline multilayer structure including a crystal substrate having a corundum structure, the crystal substrate including an uneven portion on a crystal-growth surface of the crystal substrate in a direction that is perpendicular or approximately perpendicular to the c-axis; an epitaxial layer provided on the uneven portion, the epitaxial layer including a lateral growth area that includes a corundum structure, and a crystal-growth direction of the lateral growth area is parallel or approximately parallel to the crystal-growth surface. Such a crystalline multilayer structure is also included in the disclosure. According to an embodiment of the disclosure, it is preferable that the uneven portion is formed directly or via another layer on the crystal-growth surface of the crystal substrate in a direction that is perpendicular or approximately perpendicular to the a-axis. Here, the uneven portion includes a concave portion and/or convex portion.

The term "crystalline multilayer structure" means a structure including one or more crystalline layers. The crystalline multilayer structure may include a layer other than a crystalline layer (an amorphous layer, for example). Further, the crystal layer is preferably a single crystal layer, it may be a polycrystalline layer. Further, according to an embodiment of the disclosure, the term "a direction that is parallel or substantially parallel to the crystal-growth surface" usually means that an angle formed between a certain direction and a direction parallel to the crystal-growth surface of the crystal substrate (main surface) is within a range of ±10 degrees. Also, the term "parallel or substantially parallel to the crystal-growth surface" means that the angle is within a range of ±5 degrees.

Figure 7:
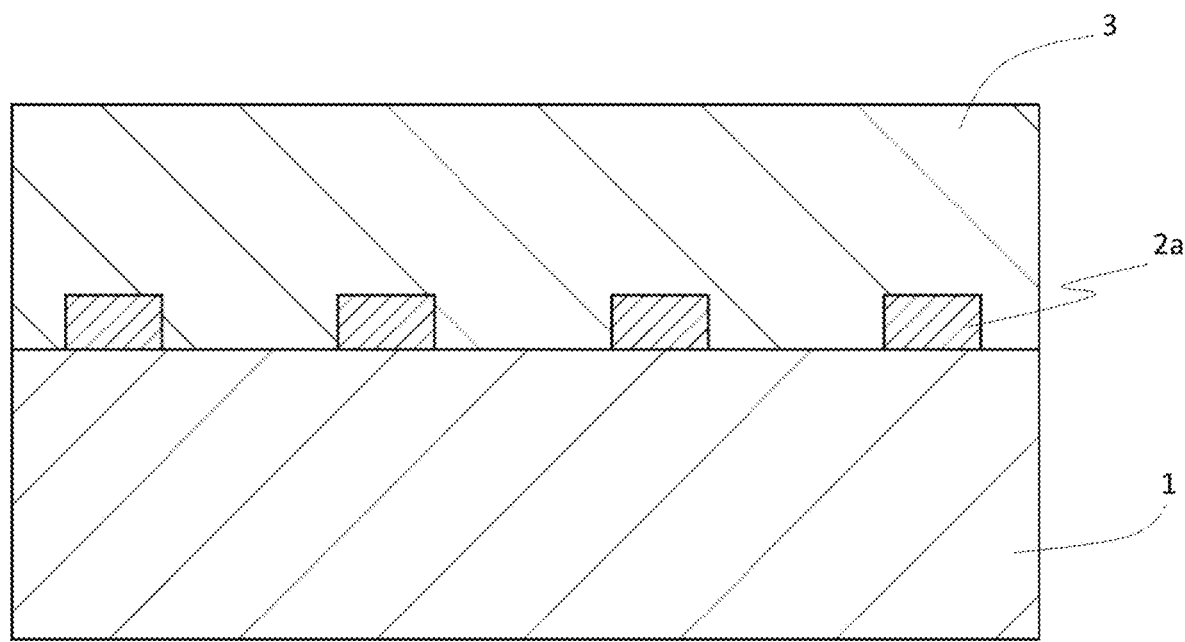
FIG. 7 is a schematic diagram illustrating an embodiment of a multilayer structure.
Figure 8:
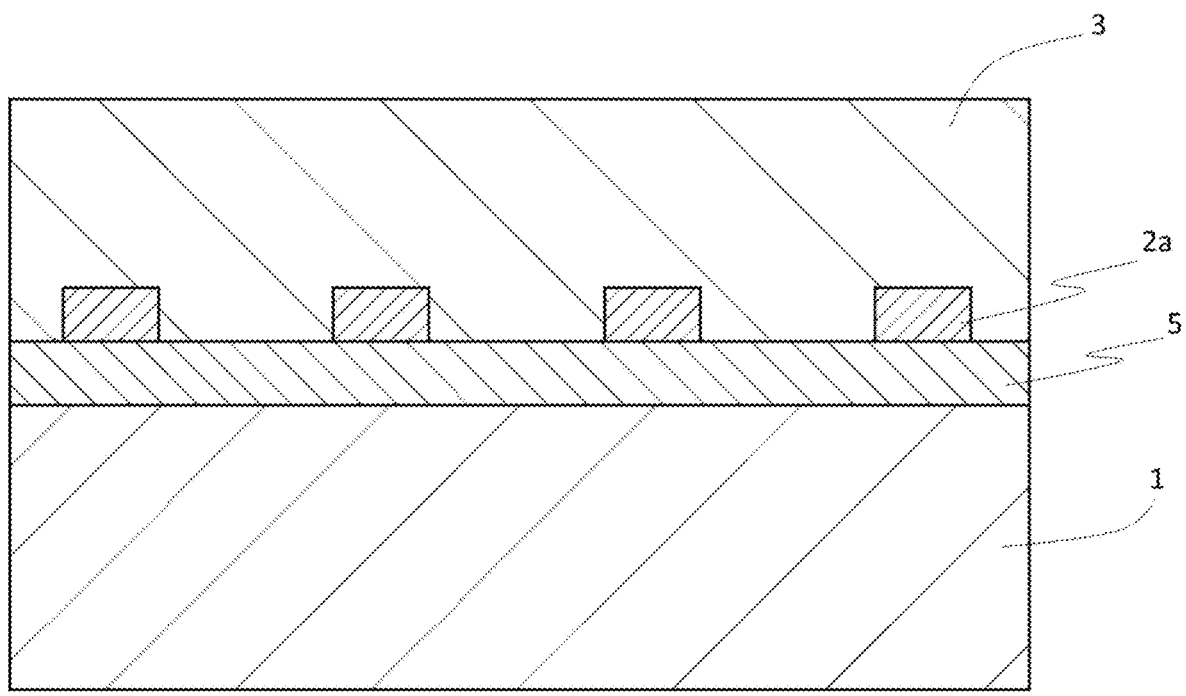
FIG. 8 is a schematic cross-sectional diagram illustrating an embodiment of the crystalline multilayer structure (with buffer layer).

FIG. 7 is a schematic cross-sectional diagram illustrating an embodiment of a of a multilayer structure. The crystalline multilayer structure of FIG. 7 includes a crystal substrate 1 and a convex portion 2a that is formed on the crystal substrate 1 and an epitaxial layer that is crystal-grown on the convex portion 2a. The epitaxial layer 3 includes a laterally grown film having a corundum structure, due to a presence of the convex portion 2a. The obtained crystal film having a corundum structure is a high-quality crystal film that is completely different from a crystal film having a corundum structure obtained without using the uneven portion. Further, an example in the case of providing a buffer layer is illustrated in FIG. 8. A crystalline multilayer structure of FIG. 8 includes a crystal substrate 1 and a buffer layer 5 that is formed on the crystal substrate 1. A convex portion 2a is formed on the buffer layer 5. An epitaxial layer 3 is formed on the convex portion 2a. The crystalline multilayer structure of FIG. 8 also includes a laterally grown corundum-structured film with an enhanced quality, due to a presence of the convex portion 2a.

The epitaxial layer usually includes a corundum-structured lateral growth area that is substantially free from a facet growth area. According to an embodiment of the disclosure, it is preferable that the crystal growth direction of the lateral growth area is a c-axis direction or substantially c-axis direction. According to an embodiment of the disclosure, the term "c-axis direction or substantially c-axis direction" usually means that the angle formed between the direction and the c-axis direction is within the range of ±10 degrees. According to an embodiment of the disclosure, the term "c-axis direction or substantially c-axis direction" preferably means that the angle formed between the direction and the c-axis direction is within a range of ±5 degrees. Further, according to an embodiment of the disclosure, the lateral growth area preferably includes a dislocation line. The dislocation line is preferably extended in a direction that is parallel or substantially parallel to the crystal-growth surface of the crystal substrate. According to an embodiment of the disclosure, it is preferable that a number of the dislocation lines that extends in the direction that is parallel or substantially parallel to the crystal-growth surface of the crystal substrate is larger than a number of dislocation line that extends in other directions. Such an epitaxial layer can be easily formed by the above-mentioned preferred film forming method.

In addition, according to an embodiment of the disclosure, it is preferable that the corundum-structured lateral growth area contains a metal oxide as a major component containing at least one or more metals selected from a metal of period 4 to period 6 of the periodic table. The metal comprises at least gallium, indium, rhodium or iridium. The term "major component" herein means, for example, when the lateral growth area includes a metal oxide that is $\alpha$-$Ga_2O_3$, the lateral growth area contains $\alpha$-$Ga_2O_3$ in that an atomic ratio of gallium in the metal element of the lateral growth area is equal to or more than 0.5. According to an embodiment of the disclosure, the atomic ratio of gallium in the metal element of the lateral growth area is preferably equal to or more than 0.7 or more, and is more preferably equal to or more than 0.8.

Further, according to an embodiment of the disclosure, it is preferable to form another epitaxial film on the epitaxial layer of the crystalline multilayer structure. By forming another epitaxial film in this way, a crystalline multilayer structure may be obtained more easily. The obtained crystalline multilayer structure includes: a crystal substrate having a corundum structure, the crystal substrate including an uneven portion on a crystal-growth surface of the crystal substrate in a direction that is perpendicular or approximately perpendicular to the c-axis; an epitaxial layer provided on the uneven portion, the epitaxial layer including a lateral growth area that includes a corundum structure, and a crystal-growth direction of the lateral growth area is parallel or approximately parallel to the crystal-growth surface. Further, by forming another epitaxial film in this way, a crystalline multilayer structure may be obtained more easily. The obtained crystalline multilayer structure includes: a crystal substrate having a corundum structure, the crystal substrate including an uneven portion on a crystal-growth surface of the crystal substrate in a direction that is perpendicular or approximately perpendicular to the c-axis; a crystalline oxide that is formed by bonding a first crystalline oxide and a second crystalline oxide that are crystal-grown in a direction that is parallel or approximately parallel to the crystal-growth surface of the crystal substrate; an epitaxial layer provided on the bonding surface of the first crystalline oxide and the second crystalline oxide. Such a preferred crystalline multilayer structure includes an epitaxial film. The epitaxial film includes a lateral growth area that is substantially free from a facet growth area and the epitaxial film has further reduced dislocation density even when the epitaxial film has a corundum structure. When depositing another epitaxial film on the epitaxial layer of the crystalline multilayer structure, it is preferable to form the epitaxial film (second crystal layer) after forming an uneven portion on the epitaxial layer (first crystal layer). Such a configuration is preferable since the dislocation density of the film is more preferably reduced.

According to an embodiment of the disclosure, it is preferable that the crystalline oxide is formed by bonding the first crystalline oxide and the second crystalline oxide that are crystal-grown in a direction that is parallel or approximately parallel to the c-axis. Also, according to an embodiment of the disclosure, it is preferable that the epitaxial layer is substantially free from a dislocation line, or the epitaxial layer includes a dislocation line that is extending in a direction parallel to or substantially parallel to the crystal-growth surface of the crystal substrate. Further, it is preferable that the epitaxial layer is substantially free from a facet growth area. Such an epitaxial layer may be easily formed by the above-mentioned preferred film forming method.

Also, according to an embodiment of the disclosure, it is preferable that the corundum-structured epitaxial layer contains a metal oxide, as a major component, containing at least one or more metals selected from period 4 to period 6 of the periodic table. According to an embodiment of the disclosure, it is more preferable that the metal includes at least gallium, indium, rhodium or iridium. The term "major component" herein means, for example, when the epitaxial layer includes a metal oxide that is $\alpha$-$Ga_2O_3$, the epitaxial layer contains $\alpha$-$Ga_2O3$ in that an atomic ratio of gallium in the metal element of the epitaxial layer is equal to or more than 0.5. According to an embodiment of the disclosure, the atomic ratio of gallium in the metal element of the epitaxial layer is preferably equal to or more than 0.7 or more, and is more preferably equal to or more than 0.8.

The crystalline multilayer structure is useful for semiconductor devices. Examples of the semiconductor devices provided using the crystalline multilayer structure includes transistors such as MIS (Metal Insulator Semiconductor) and HEMT (High Electron Mobility Transistor), TFT (Thin Film Transistor), Schottkey barrier diodes using a semiconductor-metal junction, JBS (Junction Barrier Schottky Diode), PN or PIN diodes including other P-type layers, and light-receiving-emitting devices. According to an embodiment of the disclosure, the crystalline multilayer structure may be applied to semiconductor devices as it is, or applied to semiconductor devices after peeling off the crystalline oxide semiconductor film from the crystal substrate.

Figure 11:
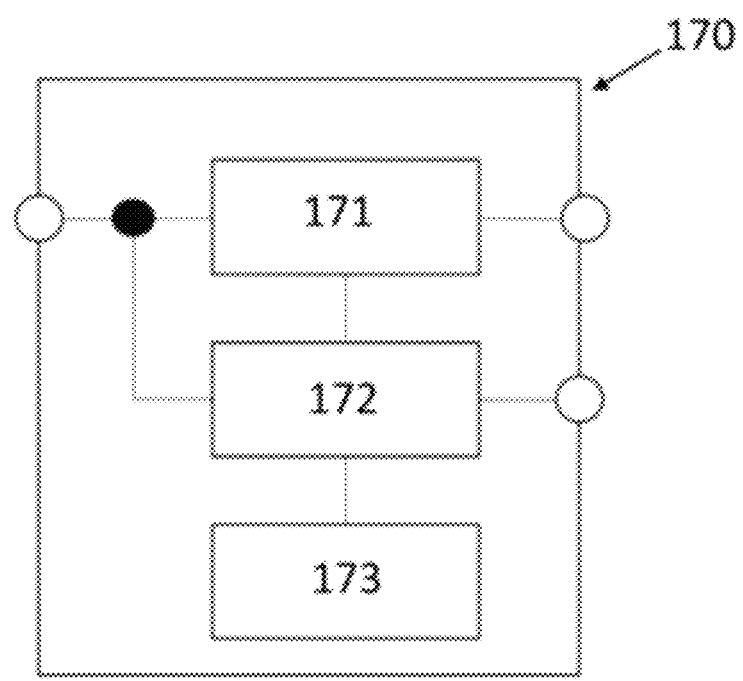
FIG. 11 is a schematic diagram illustrating an embodiment of power source system.
Figure 12:
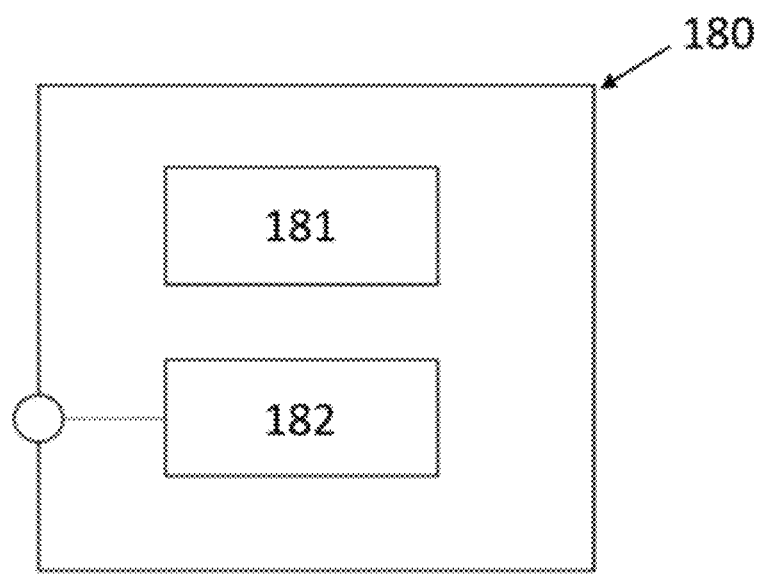
FIG. 12 is a schematic diagram illustrating an embodiment of a system device.
Figure 13:
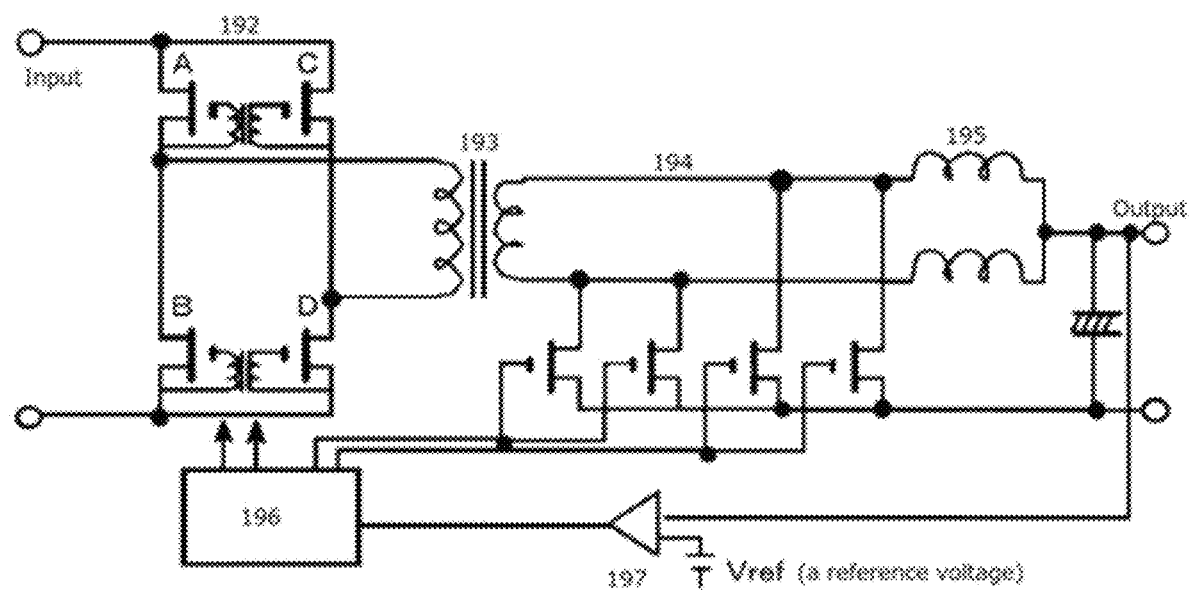
FIG. 13 is a schematic diagram illustrating an embodiment of a circuit diagram of power source device.

The semiconductor device according to an embodiment of the disclosure may be used as a power module, an inverter, and/or a converter in combination with a known structure. Also, a semiconductor device according to an embodiment of the disclosure may be used in a semiconductor system including a power source. In the power source, the semiconductor device may be electrically connected, by a known structure and/or method, to a wiring pattern in the semiconductor system. FIG. 11 is a schematic diagram illustrating an embodiment of a power source system. The power source system 170 of FIG. 11 includes two or more power source devices 171 and 172, and a control circuit 173. As illustrated in FIG. 12, the power source system 182 may be used for a system device 180 in combination with an electric circuit 181. An example of a power source circuit of a power source device is illustrated in FIG. 13. The power source circuit of FIG. 13 includes a power circuit and a control circuit. A DC voltage is switched at high frequencies by an inverter (configured with MOSFET A to D) to be converted to AC, followed by insulation and transformation by a transformer. The voltage is then rectified by a rectification MOSFET and then smoothed by a DCL (smoothing coils L1 and L2) and a capacitor to output a direct current voltage. At this point, the output voltage is compared with a reference voltage by a voltage comparator 197 to control the inverter 192 and the rectification MOSFETs 194 by a PWM control circuit 196 to have a desired output voltage.

Example 1

1. Film Formation Apparatus

The film forming apparatus 19 illustrated in FIG. 9 was used in this example.

2. Preparation of a Raw Material Solution

As a raw material solution, an aqueous solution of gallium chloride (gallium concentration: 0.1 mol/L) is prepared by adding hydrochloric acid at a volume ratio of 20%.

3. Preparation for Film Formation

The raw material solution 24a obtained in the above 2. was accommodated in the mist generation source 24. Then, as a substrate 20, an m-plane sapphire substrate with a stripe-shaped mask pattern provided in a a-axis direction was placed on the hot plate 28. The hotplate 28 was activated to raise a temperature of the hot plate 28 up to 550° C. The first flow-control valve 23a and the second flow-control valve 23b were opened to supply carrier gas from the gas supply device 22a and the diluted carrier gas supply device 22b, which are the source of carrier gas, into the deposition chamber 30.

After the atmosphere in the deposition chamber 30 was sufficiently replaced with the carrier gas, the flow rate of the carrier gas from the carrier gas device 22a was regulated at 1.0 L/min. In this embodiment, oxygen was used as the carrier gas.

4. Film Formation

Figure 14:
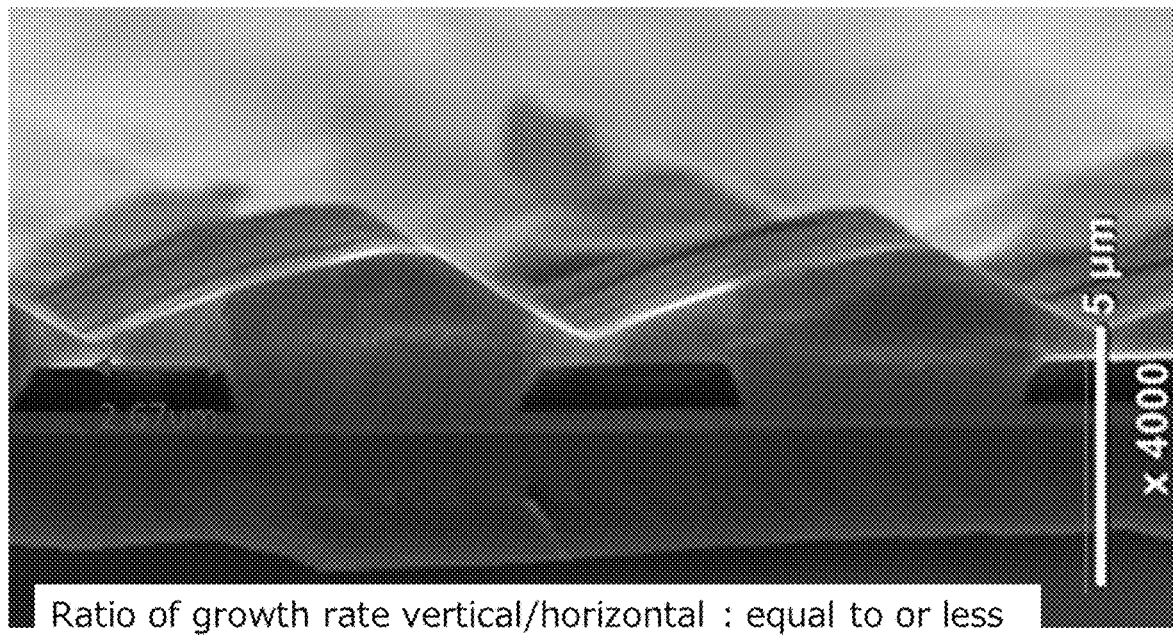
FIG. 14 is as diagram illustrating an observation results of a cross-section of a film in an example.
Figure 15:
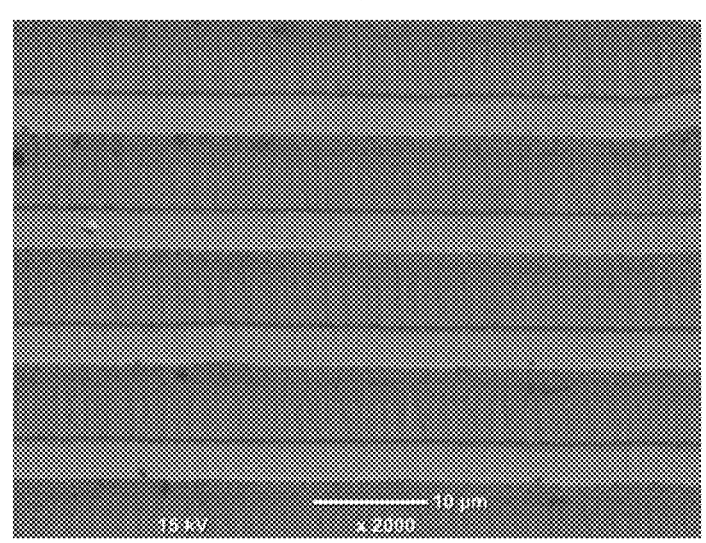
FIG. 15 is a diagram illustrating an observation results of an top surface of a film in an example.

The ultrasonic transducer was then vibrated at 2.4 MHz. The vibration was propagated through the water 25a to the raw material solution 24a to atomize the raw material solution 24a to form mist (atomized droplets) 24b. The mist 24b was carried by the carrier gas and introduced in the deposition chamber 30. The mist was thermally reacted at 550° C. under an atmospheric pressure on the substrate 20 to form a film on the substrate 20. A film formation time was 2 hours. Using an X-ray diffraction device (XRD), a phase of the obtained film was identified and revealed to be alpha $Ga_2O_3$ single-crystal film. Further, a cross section of the obtained film was observed by a microscope. The microscopic image is illustrated in FIG. 14. Also, a microscope image of observing the top surface the obtained film is illustrated in FIG. 15. As apparent from FIGS. 14 and 15, a facet growth was not observed. A c-axis ELO film with an enhanced quality that is free from without dislocation was obtained.

Comparative Example 1

A film was obtained by a method similarly to the method similarly to Example 1, except that the flow rate of the carrier gas was set at 4 L/min so as not to be a feed rate limiting, and the flow rate of the carrier gas (diluted) was set at 0.5 L/min. The resulting film was an $\alpha$-$Ga_2O_3$ film. A triangular facet structure was confirmed in the obtained films. And, inside the facet, the screw dislocation entered obliquely.

Example 2

1. Formation of a First Crystal Layer

A first crystal layer was obtained by a method similarly to example 1, except for the deposition temperature was 600° C., in the same manner as in Example 1, to form a first crystal layer. The obtained film was identified using an X-ray diffractions device, and revealed to be alpha $Ga_2O_3$ single-crystal film.

2. Formation of a Second Crystal Layer

A stripe-shaped mask pattern was formed on the first crystalline film obtained in the above 1. The stripe-shaped mask pattern was formed in an a-axis direction. Here, the mask pattern was formed so that an opening is provided on the bonding surface of the crystalline oxide in the first crystal layer. The second crystal layer was formed on the obtained first crystal film with the mask pattern in the same method as described above 1. The obtained film was identified using an X-ray diffractometer, and revealed to be $\alpha$-$Ga_2O_3$ single-crystal film.

3. Evaluation

Figure 16:
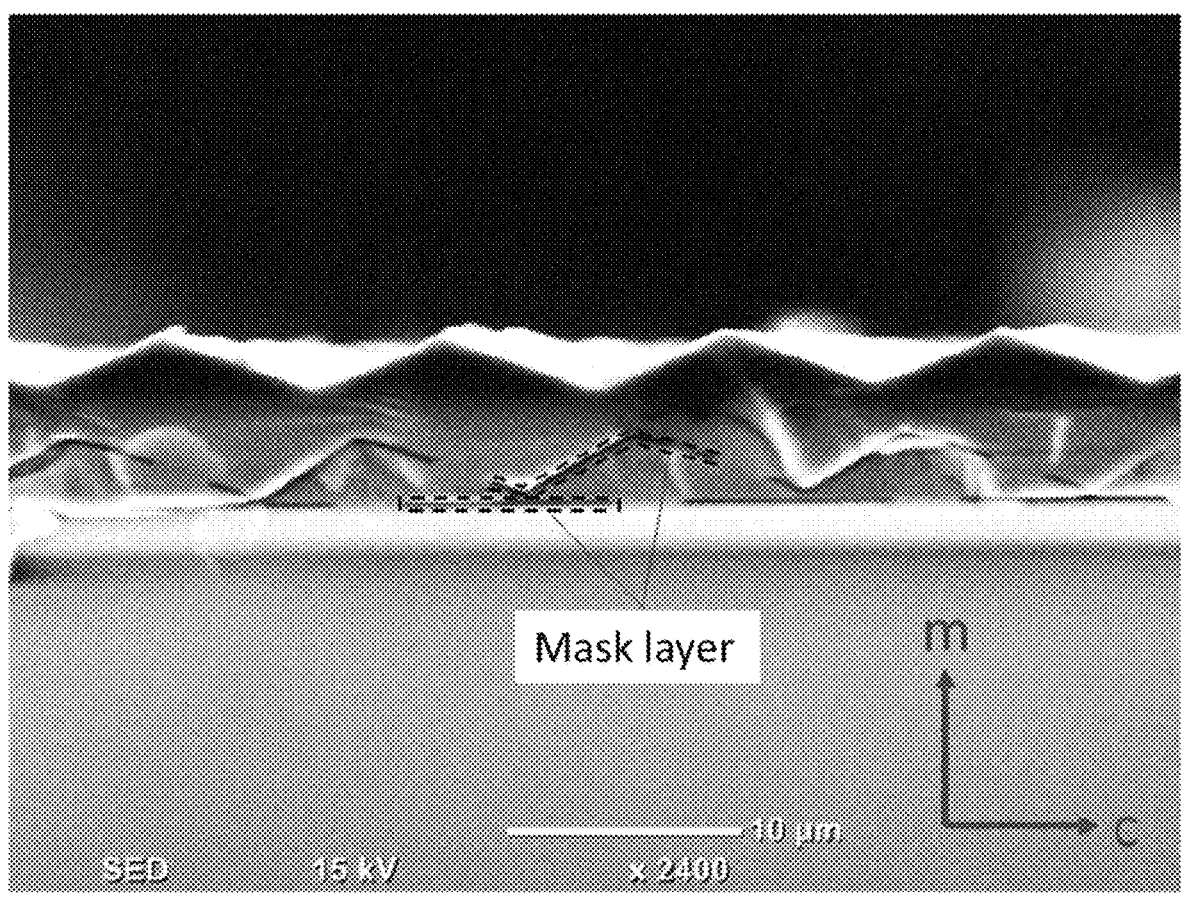
FIG. 16 is a diagram illustrating an observation results of a cross-section of a film in an example.

A cross section of the obtained film was observed by a microscope. The microscopic image is illustrated in FIG. 16. As apparent from FIG. 16, a crystalline oxide is formed by bonding a first crystalline oxide and a second crystalline oxide that are crystal-grown in a direction that is parallel or substantially parallel to the c-axis. Also, a corundum-structured epitaxial layer is formed on the bonding surface of the crystalline oxide. Furthermore, as a result of TEM observation of the obtained film, a facet growth was not observed. Also, a measurement of dislocation density is conducted. It was found that the dislocation density of the obtained film is smaller at two orders of magnitude than a film obtained by using a substrate without a mask pattern.

INDUSTRIAL APPLICABILITY

Film forming method and crystalline multilayer structure according to an embodiment of the disclosure may be used in various fields such as semiconductors (for example, compound semiconductor electronic devices), electronic components and electric equipment components, optical and electronic photography-related devices and industrial members. Film forming method and a crystalline multilayer structure according to an embodiment of the disclosure is especially useful for semiconductor devices and members of semiconductor devices.

EXPLANATION OF NUMBERS 1 crystal substrate
1a crystal-growth surface
2a convex portion
2b concave portion
3 epitaxial layer
4 mask layer
5 buffer layer
19 film forming apparatus
20 substrate
21 susceptor
22a carrier gas supply device
22b diluted carrier gas supply device
23a first flow control valve
23b second flow control valve
24 mist generation source
24a raw material solution
25 container
25a water
26 ultrasonic transducer
27 supply pipe
28 heater (hot plate)
29 air outlet
30 film forming (deposition) chamber
170 power source system
171 power source device
172 power source device
173 control circuit
180 system device
181 electric circuit
182 power source system
192 inverter
193 transformer
194 MOSFET
195 DCL
196 PWM control circuit
197 voltage comparator

What is claimed is:

1. A method of forming a film, comprising:
forming an epitaxial film on a crystal-growth surface of a crystal substrate directly or via another layer,
the crystal substrate having a corundum structure,
the crystal substrate having an uneven portion on the crystal substrate, and
forming the epitaxial film in a condition of a supply rate limiting state.

2. The method of forming the film according to claim 1, wherein the uneven portion is provided in a direction that is perpendicular or approximately perpendicular to the c-axis.

3. The method of forming the film according to claim 1, wherein a film is formed by generating and floating atomized droplets by atomizing a raw material solution including a metal;
carrying the floated atomized droplets onto a surface of the crystal substrate by using a carrier gas; and
causing a thermal reaction of the atomized droplets.

4. The method of forming the film according to claim 3, wherein the carrying the atomized droplets is conducted in a condition of a flow rate of the carrier gas that is supply rate limiting state.

5. The method of forming the film according to claim 4, wherein the metal includes at least one or more metals selected from a metal of period 4 to period 6 in the periodic table.

6. The method of forming the film according to claim 3, wherein the metal includes at least a metal selected from gallium, indium, rhodium and iridium.

7. The method of forming the film according to claim 1, wherein the uneven portion is formed on the crystal-growth surface of the crystal substrate in a stripe shape or in a dot shape.

8. A crystalline multilayer structure comprising:
a crystal substrate having a corundum structure,
the crystal substrate including an uneven portion provided directly or via another layer on a crystal-growth surface of the crystal substrate in a direction that is perpendicular or approximately perpendicular to the c-axis;
an epitaxial layer provided on the uneven portion,
the epitaxial layer including a lateral growth area that includes a corundum structure, and
a crystal-growth direction of the lateral growth area is parallel or approximately parallel to the crystal-growth surface.

9. The crystalline multilayer structure according to claim 8,
wherein the crystal-growth direction of the lateral growth area is parallel or approximately parallel to the c-axis.

10. The crystalline multilayer structure according to claim 8,
wherein the lateral growth area is substantially free from a facet growth area.

11. The crystalline multilayer structure according to claim 8,
wherein the lateral growth area includes a metal oxide as a major component, and
wherein the metal oxide includes at least one or more metals selected from a metal of period 4 to period 6 of the periodic table.

12. The crystalline multilayer structure according to claim 11,
wherein the metal includes at least a metal selected from gallium, indium, rhodium and iridium.

13. The crystalline multilayer structure according to claim 8,
wherein the uneven portion is formed on the crystal-growth surface of the crystal substrate in a stripe shape.

14. A crystalline multilayer structure, comprising:
a crystal substrate having a corundum structure,
the crystal substrate including an uneven portion provided directly or via another layer on a crystal-growth surface of the crystal substrate in a direction that is perpendicular or approximately perpendicular to the c-axis;
a crystalline oxide that is formed by bonding a first crystalline oxide and a second crystalline oxide that are crystal-grown in a direction that is parallel or approximately parallel to the crystal-growth surface of the crystal substrate;
an epitaxial layer provided on the bonding surface of the first crystalline oxide and the second crystalline oxide.

15. The crystalline multilayer structure according to claim 14,
wherein the crystalline oxide is formed by bonding the first crystalline oxide and the second crystalline oxide that are crystal-grown in a direction that is parallel or approximately parallel to the c-axis.

16. The crystalline multilayer structure according to claim 14,
wherein the epitaxial layer is substantially free from a facet growth area.

17. The crystalline multilayer structure according to claim 14,
wherein the epitaxial layer includes a metal oxide as a major component, and
wherein the metal oxide includes at least one or more metals selected from a metal of period 4 to period 6 of the periodic table.

18. The crystalline multilayer structure according to claim 17,
wherein the metal includes at least a metal selected from gallium, indium, rhodium and iridium.

19. The crystalline multilayer structure according to claim 14,
wherein the uneven portion is formed on the crystal-growth surface of the crystal substrate in a stripe shape.

20. A method of forming a film, comprising:
forming an epitaxial film on a crystal-growth surface of a crystal substrate directly or via another layer,
the crystal substrate having a corundum structure, and
forming the film in a condition of a supply rate limiting state.

21. The method of forming the film according to claim 20,
wherein the film is crystal-grown to a lateral direction to the crystal-growth surface.

22. The method of forming the film according to claim 21,
wherein the film is crystal-grown to a direction that is parallel or approximately parallel to the c-axis.

23. The method of forming the film according to claim 20,
wherein the film is formed by generating atomized droplets by atomizing a raw material solution including a metal;
carrying the atomized droplets onto a surface of the crystal substrate by using a carrier gas; and
causing a thermal reaction of the atomized droplets.

24. The method of forming the film according to claim 23,
wherein a flow rate of the carrier gas is not more than 1 LPM.

25. The method of forming the film according to claim 23,
wherein the metal includes at least a metal selected from gallium, indium, rhodium and iridium.

* * * * *